United States Patent
Lin et al.

(10) Patent No.: US 8,427,224 B2
(45) Date of Patent: Apr. 23, 2013

(54) ON-CHIP ACTIVE DECOUPLING CAPACITORS FOR REGULATING VOLTAGE OF AN INTEGRATED CIRCUIT

(75) Inventors: Tien-Hung Lin, Hsinchu (TW); Po-Tsang Huang, Hsinchu (TW); Wei Hwang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 54 days.

(21) Appl. No.: 13/190,619

(22) Filed: Jul. 26, 2011

(65) Prior Publication Data

US 2013/0027122 A1 Jan. 31, 2013

(51) Int. Cl.
*G06F 7/64* (2006.01)
(52) U.S. Cl.
USPC .......................................... 327/337; 327/530
(58) Field of Classification Search ............ 327/77, 327/337, 530, 534, 535, 537, 538, 540, 541, 327/543
See application file for complete search history.

(56) References Cited

U.S. PATENT DOCUMENTS

| | | | |
|---|---|---|---|
| 6,639,430 B2 * | 10/2003 | Bult et al. ........................ | 327/57 |
| 6,906,579 B2 * | 6/2005 | Masleid et al. ................ | 327/538 |
| 2012/0008443 A1 * | 1/2012 | Hebig et al. ................... | 365/203 |
| 2012/0091593 A1 * | 4/2012 | Cheng et al. ................... | 257/774 |
| 2012/0105024 A1 * | 5/2012 | Lin et al. ........................ | 323/234 |

* cited by examiner

*Primary Examiner* — Lincoln Donovan
*Assistant Examiner* — Sibin Chen
(74) *Attorney, Agent, or Firm* — Rosenberg, Klein & Lee

(57) ABSTRACT

On-chip active decoupling capacitors for regulating the voltage of an integrated circuit include a reference voltage generator, a latch-based comparator and switched DECAPs. The latched-based comparator is for comparing a reference voltage generated by the reference voltage generator and a supply voltage of the integrated circuit and outputting a comparison result. The switched DECAPs includes at least two capacitors and a plurality of switches, and coupling the at least two capacitors into a parallel configuration to sink current or a series configuration to source current based on the comparison result output by the latch-based comparator. The aforementioned on-chip active decoupling capacitors not only have lower power consumption, but also larger detection range.

9 Claims, 4 Drawing Sheets

US 8,427,224 B2

ON-CHIP ACTIVE DECOUPLING CAPACITORS FOR REGULATING VOLTAGE OF AN INTEGRATED CIRCUIT

BACKGROUND OF THE INVENTION

1. Field of the Invention

The present invention relates to a voltage regulator, and more particularly to on-chip active decoupling capacitors for regulating voltage of an integrated circuit to suppress power noise.

2. Description of the Prior Art

Three-dimensional (3D) integration technology can provide enormous advantages in achieving multi-functional integration, improving system speed and reducing power consumption for future generations of integrated circuits. However, stacking multiple dies would face a severe problem of the power integrity. In 3D integration, the increasing supply current through both package and through-silicon-via (TSV) would lead to a large simultaneous switching noise potentially. Moreover, the supply impedance response is dominated by both the packages and TSVs.

To suppress the power noise, decoupling capacitors (DE-CAPs) are widely used. DECAPs perform as a local reservoir of charge, which is released when the current load varies. But the usage of the on-chip passive DECAPs is limited by two major constraints, including a great amount of gate tunneling leakage and large area occupation. Nowadays, current suppression techniques have been proposed to reduce power supply noise, and the resonant supply noise is suppressed via the delay-line-based and OP-based detection circuits with switched DECAPs, respectively. However, the efficiency of these noise suppression techniques would be reduced significantly by the leakage current in nano-scale technologies.

SUMMARY OF THE INVENTION

The present invention is directed to on-chip active decoupling capacitors for regulating voltage of an integrated circuit, which detect a variation of a supply power by a latch-based comparator and couples at least two capacitors into, a parallel configuration or a series configuration to suppress power noise according to the comparison result detected. Therefore, the on-chip active decoupling capacitors of the present invention have lower power consumption and larger detection range.

In one embodiment, the proposed on-chip active decoupling capacitors for regulating voltage of an integrated circuit include a reference voltage generator, a latch-based comparator and switched decoupling capacitors (DECAPs). The reference voltage generator is configured for generating a reference voltage. The latch-based comparator is electrically connected with the reference voltage generator for comparing the reference voltage and a supply voltage of the integrated circuit and outputs a comparison result. The switched DECAPs is electrically connected between a high voltage node and a low voltage node of a power grid of the integrated circuit and comprises at least two capacitors and a plurality of switches, wherein according to the comparison result outputted from the latch-based comparator the switched DECAPs couples the at least two capacitors into the parallel configuration to sink current when the supply voltage is larger than an upper limit voltage, and couples the at least two capacitors into the series configuration to source current when the supply voltage is smaller than a lower limit voltage.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

The detailed explanation of the present invention is described as follows. The described preferred embodiments are presented for purposes of illustrations and description, and they are not intended to limit the scope of the present invention.

Figure 1:
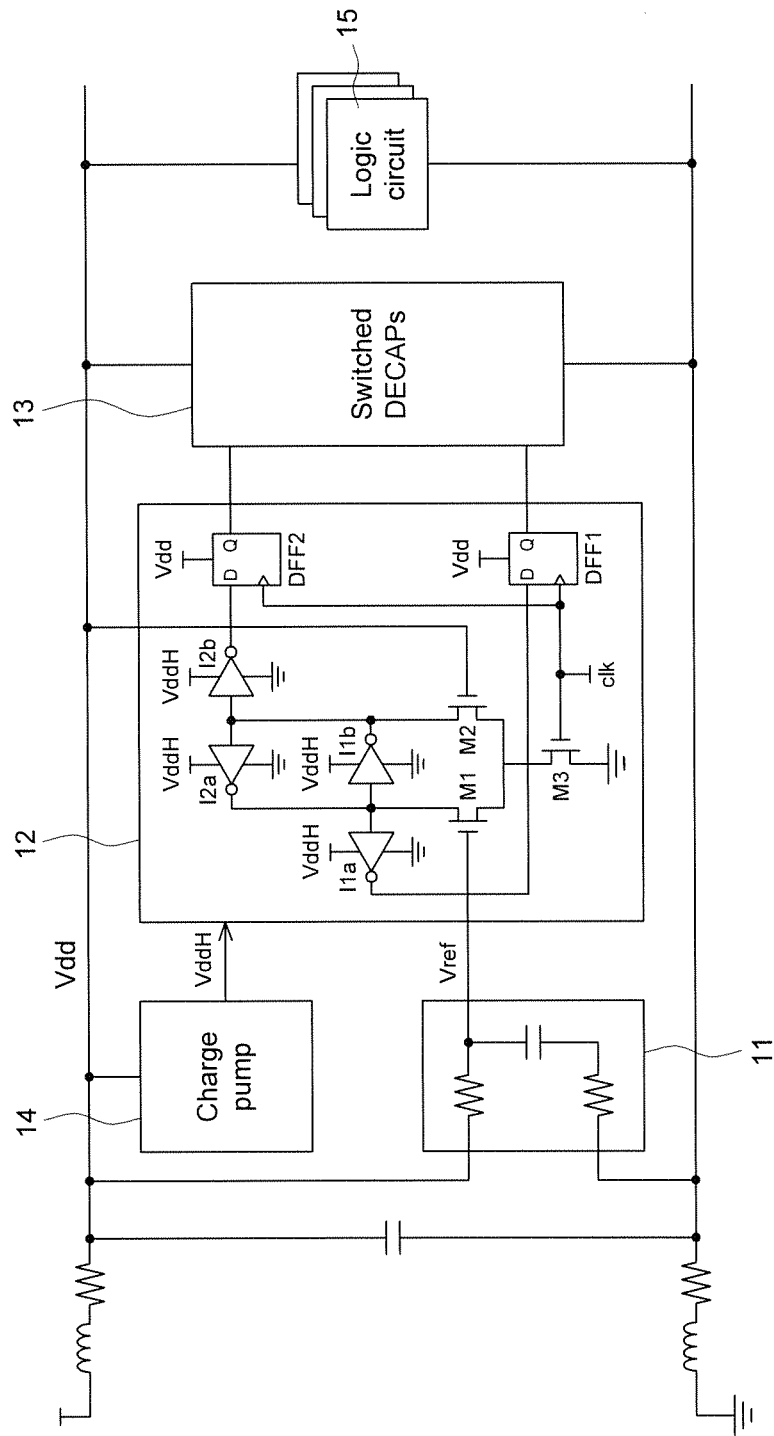
FIG. 1 is a diagram schematically illustrating on-chip active decoupling capacitors for regulating voltage of an integrated circuit according to an embodiment of the present invention.

Referring to FIG. 1, according to an embodiment, on-chip active decoupling capacitors for regulating voltage of an integrated circuit include a reference voltage generator 11, a latch-based comparator 12 and switched decoupling capacitors (DECAPs) 13. The reference voltage generator 11 is for generating a reference voltage Vref. For example, the reference voltage generator 11 can be a low pass filter. The latch-based comparator 12 is for comparing the reference voltage Vref and a supply voltage Vdd of the integrated circuit and outputting a comparison result. The switched DECAPs 13 is electrically connected between a high voltage node and a low voltage node of a power grid of the integrated circuit. The switched DECAPs 13 can couple at least two capacitors into a parallel configuration to sink current or a series configuration to source current based on the comparison result outputted by the latch-based comparator 12.

Figure 2:
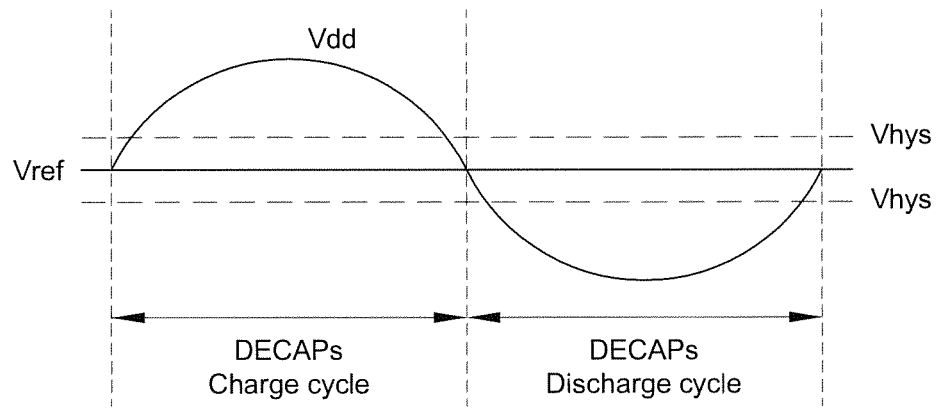
FIG. 2 is a diagram schematically illustrating a charge cycle and a discharge cycle of switched decoupling capacitors (DECAPs)
Figures 3A, 3B:
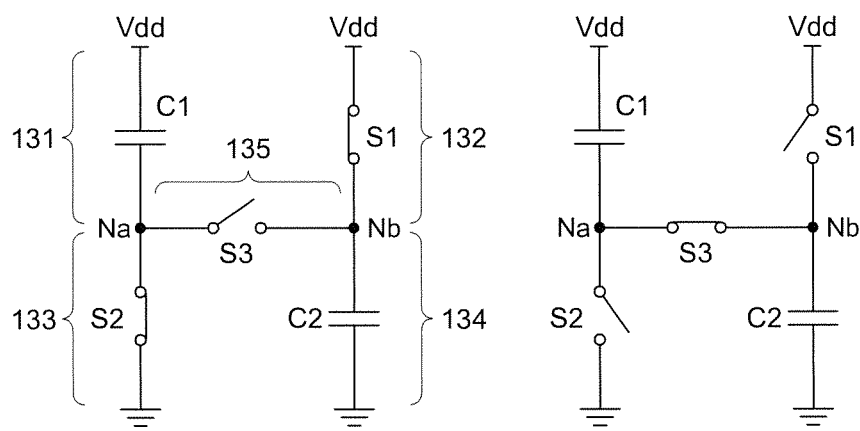
FIG. 3a and FIG. 3b are diagrams schematically illustrating configurations of switched DECAPs of the on-chip active decoupling capacitors according to an embodiment of the present invention.

Referring FIG. 2, FIG. 3a and FIG. 3b, according to an embodiment, the switched DECAPs 13 can be a bridge circuit including a first capacitor C1, a second capacitor C2, a first switch S1, a second switch S2 and a third switch S3. The first capacitor C1 is disposed in a first path 131 coupling the high voltage node of the power grid of the integrated circuit to a first intermediate node Na. The first switch S1 is disposed in a second path 132 coupling the high voltage node to a second intermediate node Nb. The second switch S2 is disposed in a third path 133 coupling the first intermediate node Na to the low voltage node of the power grid of the integrated circuit. The second capacitor C2 is disposed in a fourth path 134 coupling the second intermediate node Nb to the low voltage node. The third switch S3 is disposed in a bridge section 135 coupling the first intermediate node Na to the second intermediate node.

When the supply voltage Vdd is greater than the reference voltage Vref, as illustrated by the charging cycle of the DECAPs in FIG. 2, the switched DECAPs 13 couples the first capacitor C1 and the second capacitor C2 into the parallel configuration by turning on the first switch S1 and the second switch S2, and turning off the third switch S3 to sink the current, as illustrated in FIG. 3a. When the supply voltage Vdd is smaller than the reference voltage Vref, as illustrated by the discharging cycle of the DECAPs in FIG. 2, the switched DECAPs 13 couples the first capacitor C1 and the second capacitor C2 into the series configuration by turning on the third switch S3 and turning off the first switch S1 and the second switch S2, as illustrated in FIG. 3b. Therefore, based on the comparison result outputted by the latch-based comparator 12, the switched DECAPs 13 couples the first capacitor C1 and the second capacitor C2 into the parallel configuration or the series configuration to adjust the voltage of the integrated circuit and thereby suppress power noise.

Referring still to FIG. 1, the latch-based comparator 12 includes two first inverters I1a, I1b with their input nodes being electrically connected with each other; two second inverters I1a, I2b with their input nodes being electrically connected with each other, a first D flip-flop DFF1, a second D flip-flop DFF2, a first N-type metal oxide semiconductor field effect transistor (NMOS) M1, a second NMOS M2 and a third NMOS M3. An output node of one of the first inverters (e.g. the first inverter I1b as illustrated in FIG. 1) is electrically connected with the input node of the second inverters I1a, I2b. An output node of one of the second inverters (e.g. the second inverter I2a as illustrated in FIG. 1) is electrically connected with the input node of the first inverters I1a, I1b. The first D flip-flop DFF1 is configured with its data input node being electrically connected to an output node of the other first inverter I1a, and its clock input node receiving a clock signal clk. The second D flip-flop DFF2 is configured to have its data input node being electrically connected to an output node of the other second inverter I2b, and its clock input node receiving the clock signal clk. The comparison result is outputted from output nodes of the first D flip-flop DFF1 and the second D flip-flop DFF2. The first NMOS M1 is configured to have its gate receiving the reference voltage Vref and its drain being electrically connected to the input node of the first inverters I1a, I1b. The second NMOS M2 is configured to have its gate receiving the supply voltage Vdd and its drain being electrically connected to the input node of the second inverters I2a, I2b. The third NMOS M3 is configured to have its gate receiving the clock signal clk, its drain being electrically connected with sources of the first NMOS M1 and the second NMOS M2 and its source being electrically connected to the low voltage node of the power grid. According to the comparison result outputted from the output nodes of the first D flip-flop DFF1 and the second D flip-flop DFF2, the switched DECAPs 13 is informed whether the supply voltage Vdd is greater than the reference voltage Vref.

According to an embodiment, the on-chip active decoupling capacitors include a charge pump 14 for receiving the supply voltage Vdd and outputting a higher boost voltage VddH to the latch-based comparator 12 to ensure the first NMOS M1 and the second NMOS M2 to operate under saturation region.

Figure 4:
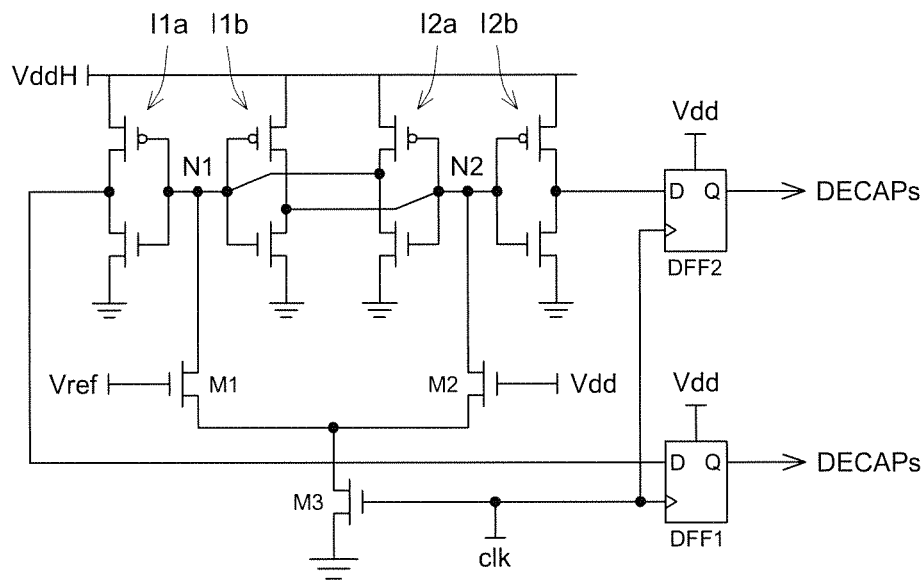
FIG. 4 is a circuit diagram schematically illustrating a latch-based comparator of the on-chip active decoupling capacitors according to an embodiment of the present invention.

Referring to FIG. 4, according to an embodiment, each of the first inverter I1a, I1b and the second inverter I2a, I2b includes a P-type metal oxide semiconductor field effect transistor (PMOS) and a NMOS which constituting a complementary metal oxide semiconductor field effect transistor (CMOS) circuit. As illustrated in FIG. 4, the PMOS and the NMOS are configured such that their gates are electrically connected with each other and used as the input node of the inverter, and their drains are electrically connected with each other and used as the output node of the inverter. A source of the PMOS is electrically connected with a voltage source; a source of the NMOS is electrically connected with the low voltage node of the power grid. According to an embodiment, the PMOS and the NMOS applied in the latch-based comparator 12 are high threshold voltage metal oxide semiconductor field effect transistors to reduce leakage power in nanometer scale technology.

The operation mechanism of the switched DECAPs 13 is described below. The frequency of the clock signal clk determines the sampling frequency of the comparison result. When the clock signal clk is HIGH, the third NMOS M3 is turned on, thereby forming two discharging paths respectively along the first NMOS M1 and the second NMOS M2 which pull down the voltage at nodes N1, N2. When the clock signal clk is LOW, the third NMOS M3 is turned off, thereby removing the two discharging paths. At this instance, the charges at the nodes N1, N2 determine the data of the weak back-to-back inverters. The first D flip-flop DFF1 and the second D flip-flop DFF2 then extracts the comparison result on the rising edge of the clock signal clk and outputs the comparison result.

Referring to FIG. 2, according to the aforementioned structure, the latched-based comparator 12 causes the switched DECAPs 13 to switch between the parallel and series configurations of the first capacitor C1 and the second capacitor C2 until a margin of a hysteresis voltage Vhys is reached. That is, only when the supply voltage Vdd is greater than an upper limit voltage equal to the reference voltage Vref plus the hysteresis voltage Vhys, then the switched DECAPs 13 switches into the parallel configuration. And only when the supply voltage Vdd is smaller than a lower limit voltage equal to the reference voltage Vref minus the hysteresis voltage Vhys, then the switched DECAPs 13 switches into the series configuration. Suppose the supply voltage Vdd is increased from an undershooting state into an overshooting state, and an initial voltage of the node N2 is HIGH. When the supply voltage Vdd is slightly greater than the reference voltage Vref, though a drain current of the second NMOS M2 is greater than that of the first NMOS M1, the discharging time is not enough to flip the data of the back-to-back inverters. Not until the supply voltage Vdd is greater than the upper limit voltage being the reference voltage Vref plus the hysteresis voltage Vhys, do the second NMOS M2 has enough driving capability to flip the data and causes the switched DECAPs 13 to switch to the parallel configuration. By the same token, when the supply voltage Vdd is decreased from the overshooting state into the undershooting state, the supply voltage Vdd needs to be smaller than the lower limit voltage being the reference voltage Vref minus the hysteresis voltage Vhys to cause the switched DECAPs 13 to switch into the series configuration. According to the above description, when the noise is smaller than the hysteresis voltage Vhys, the switched DECAPs 13 would not switch the configuration of the first capacitor C1 and the second capacitor C2 so as to prevent frequent switching of the configuration of the switched DECAPs 13 from causing an even larger noise.

Figure 5A:
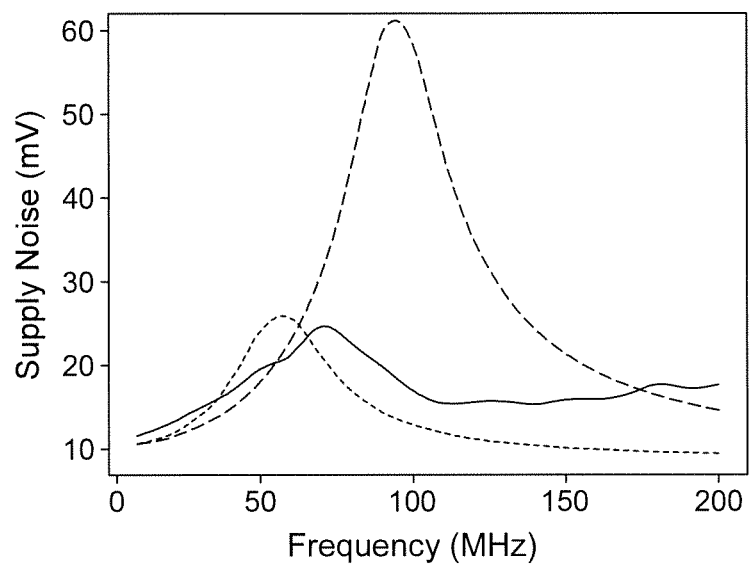
FIG. 5a and FIG. 5b are curve diagrams schematically illustrating simulation results of power noise by a passive DECAPs and the present invention.
Figure 5B:
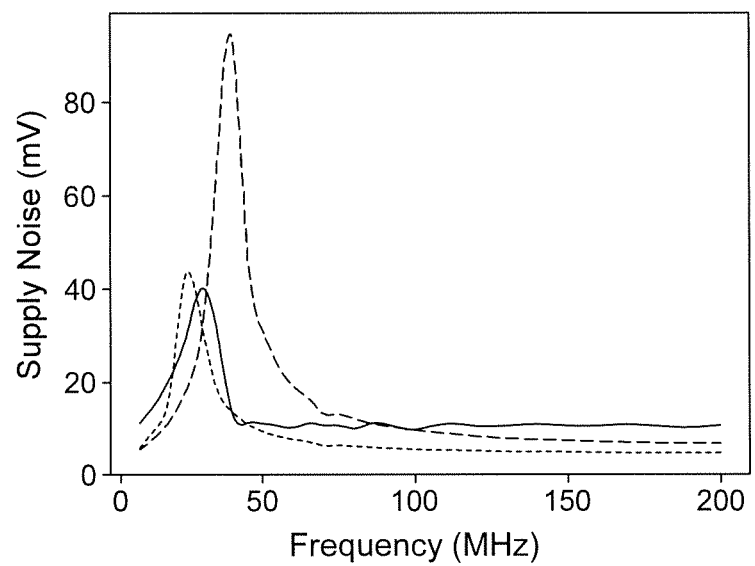

FIG. 5a and FIG. 5b show the suppressed noises resonated at 100 MHz and 40 MHz, respectively. The two configurations of the pads are set as L=0.75 nH, C=1.69 nF, R=0.14Ω and L=4.5 nH, C=1.69 nF, R=0.2852, which represent a typical supply impedance for high performance chips and the footprint and TSV impedance in 3D integration. The number of the power pins would be limited in 3D integration, and the inductance of the package would be larger than the 2D integrated circuits. Compared to the same value (200 pF) of the passive capacitance represented by long dash line, the on-chip active decoupling capacitors of the present invention represented by solid line can realize the improvements of 55% (6.9 dB) and 57.6% (7.4 dB) noise reductions for the high performance IC as illustrated in FIG. 5a and TSV 3D integration as illustrated in FIG. 5b, respectively. Additionally, in order to evaluate the boost factor of the proposed on-chip active decoupling capacitors, a great amount of passive DECAPs are traced to achieve the similar noise suppression. Therefore, the passive DECAPs with 3400 pF and 2400 pF are deployed for the similar noise regulation, as illustrated in FIG. 5a and FIG. 5b by short dash line. And thus, 17× and 12× boost factor can be achieved based on the proposed on-chip active decoupling capacitors. Moreover, the leakage power can also be reduced by 71% and 59% due to the reduced DECAP area.

To summarize the foregoing descriptions, the on-chip active decoupling capacitors for regulating voltage of an integrated circuit according to the present invention utilize a digital latch-based comparator to detect variation in supply voltage, and change the configuration of the switched DECAPs accordingly. Therefore, the on-chip active decoupling capacitors not only have lower power consumption, but also larger detection range. Besides, the design of the hysteresis voltage of the on-chip active decoupling capacitors are simple and yet effective in preventing frequent switching of the configuration of the switched DECAPs from generating larger noises. Moreover, since the reference voltage is applied to the gate of the first NMOS, the latch-based comparator requires smaller current.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. On-chip active decoupling capacitors for regulating voltage of an integrated circuit, comprising:
a reference voltage generator for generating a reference voltage;
a latch-based comparator electrically connected with the reference voltage generator for comparing the reference voltage and a supply voltage of the integrated circuit and outputting a comparison result; and
switched decoupling capacitors (DECAPs) electrically connected between a high voltage node and a low voltage node of a power grid of the integrated circuit and comprising at least two capacitors and a plurality of switches, wherein according to the comparison result outputted from the latch-based comparator the switched DECAPs couples the at least two capacitors into the parallel configuration to sink current when the supply voltage is larger than an upper limit voltage, and couples the at least two capacitors into the series configuration to source current when the supply voltage is smaller than a lower limit voltage.

2. The on-chip active decoupling capacitors according to claim 1, wherein the latch-based comparator comprising:
two first inverters configured to have input nodes thereof being electrically connected with each other;
two second inverters configured to have input nodes thereof being electrically connected with each other, an output node of one of the second inverters being electrically connected with the input node of the first inverters, and an output node of one of the first inverters being electrically connected with the input node of the second inverters;
a first D flip-flop configured to have a data input node thereof being electrically connected to an output node of the other first inverter, and a clock input node thereof receiving a clock signal;
a second D flip-flop configured to have a data input node thereof being electrically connected to an output node of the other second inverter, and a clock input node thereof receiving the clock signal;
a first N-type metal oxide semiconductor field effect transistor (NMOS) configured to have a gate thereof receiving the reference voltage and a drain thereof being electrically connected to the input node of the first inverters;
a second NMOS configured to have a gate thereof receiving the supply voltage and a drain thereof being electrically connected to the input node of the second inverters; and
a third NMOS configured to have a gate thereof receiving the clock signal, a drain thereof being electrically connected with sources of the first NMOS and the second NMOS and a source thereof being electrically connected to the low voltage node of the power grid; wherein the switched DECAPs couples the at least two capacitors into the parallel configuration or the series configuration according to the comparison result outputted from output nodes of the first D flip-flop and the second D flip-flop.

3. The on-chip active decoupling capacitors according to claim 2, wherein the first inverter comprises a P-type metal oxide semiconductor field effect transistor (PMOS) and a NMOS.

4. The on-chip active decoupling capacitors according to claim 3, wherein the PMOS and the NMOS applied in the latch-based comparator are high threshold voltage metal oxide semiconductor field effect transistors.

5. The on-chip active decoupling capacitors according to claim 2, further comprising a charge pump for receiving the supply voltage and outputting a higher boost voltage to the latch-based comparator.

6. The on-chip active decoupling capacitors according to claim 1, wherein the reference voltage generator comprises a low pass filter.

7. The on-chip active decoupling capacitors according to claim 1, wherein the switched DECAPs comprises a bridge circuit comprising:
a first capacitor disposed in a first path coupling the high voltage node to a first intermediate node;
a first switch disposed in a second path coupling the high voltage node to a second intermediate node;
a second switch disposed in a third path coupling the first intermediate node to the low voltage node;
a second capacitor disposed in a fourth path coupling the second intermediate node to the low voltage node; and
a third switch disposed in a bridge section coupling the first intermediate node to the second intermediate node; wherein the switched DECAPs couples the first capacitor and the second capacitor into the parallel configuration by turning on the first switch and the second switch or couples the first capacitor and the second capacitor into the series configuration by turning on the third switch.

8. The on-chip active decoupling capacitors according to claim 1, wherein the upper limit voltage is the reference voltage plus a hysteresis voltage, and the lower limit voltage is the reference voltage minus the hysteresis voltage.

9. The on-chip active decoupling capacitors according to claim 1, which is applied to through-silicon-via (TSV) 3D integrated circuit.

* * * * *